(12) United States Patent
Islam et al.

(10) Patent No.: US 9,083,354 B2
(45) Date of Patent: Jul. 14, 2015

(54) CLOCK SIGNAL TIMING-BASED NOISE SUPPRESSION

(71) Applicant: SILICON LABORATORIES INC., Austin, TX (US)

(72) Inventors: Imranul Islam, Austin, TX (US); Axel Thomsen, Austin, TX (US); Paul I. Zavalney, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 25 days.

(21) Appl. No.: 13/832,708

(22) Filed: Mar. 15, 2013

(65) Prior Publication Data
US 2014/0266336 A1   Sep. 18, 2014

(51) Int. Cl.
*H03L 7/06* (2006.01)
*H03L 7/081* (2006.01)

(52) U.S. Cl.
CPC ............ *H03L 7/0816* (2013.01); *H03L 7/0814* (2013.01)

(58) Field of Classification Search
None
See application file for complete search history.

(56) References Cited

U.S. PATENT DOCUMENTS

| | | | |
|---|---|---|---|
| 7,336,752 B2 * | 2/2008 | Vlasenko et al. | 375/376 |
| 8,253,455 B2 * | 8/2012 | Hyun et al. | 327/147 |
| 8,638,144 B1 * | 1/2014 | Shyu et al. | 327/158 |
| 2009/0041104 A1 * | 2/2009 | Bogdan | 375/226 |
| 2010/0123494 A1 * | 5/2010 | Heightley | 327/158 |

* cited by examiner

*Primary Examiner* — Cassandra Cox
(74) *Attorney, Agent, or Firm* — Trop, Pruner & Hu, P.C.

(57) ABSTRACT

A method includes generating one of a first clock signal and a second clock signal from the other clock signal. The first clock signal is configured to be used to synchronize an operation of an analog system, and the second clock signal is configured to be used to synchronize an operation of a digital system. The method includes using a phase detector of the analog system to measure a timing of the first clock signal relative to the second clock signal; and the method includes controlling a delay element of the digital system to regulate the timing based on the measurement by the phase detector to suppress noise in the analog system.

19 Claims, 5 Drawing Sheets

CLOCK SIGNAL TIMING-BASED NOISE SUPPRESSION

BACKGROUND

An electrical system (an integrated circuit, a computer system or a microcontroller, as examples) may contain both digital and analog subsystems. The digital subsystem may contain, as examples, a clock generator, bus interfaces (a Universal Serial Bus (USB) interface and a serial peripheral interface (SPI) interface, as examples), a serial communication interface (a universal asynchronous receiver/transmitter (UART) interface, for example), programmable timers, and so forth. The analog subsystem may include such components as an analog-to-digital converter (ADC), current drivers, voltage level translators and so forth.

SUMMARY

In an example embodiment, a method includes generating one of a first clock signal and a second clock signal from the other clock signal. The first clock signal is configured to be used to synchronize an operation of an analog system, and the second clock signal is configured to be used to synchronize an operation of a digital system. The method includes using a phase detector of the analog system to measure a timing of the first clock signal relative to the second clock signal. The generation of the clock signal includes controlling a delay element of the digital system to regulate the timing based on the measurement by the phase detector to suppress noise in the analog system.

In another example embodiment, an apparatus includes an analog system, a digital system and a clock regulation circuit. The analog system is adapted to synchronize at least one operation to a first clock signal, and the digital system is adapted to synchronize at least one operation to a second clock signal. The first and second clock signals are electrically coupled together. The clock regulation circuit is adapted to regulate a timing of the first clock signal relative to the second clock signal to control a noise contained in the first clock signal due to the coupling of the first and second clock signals. The clock regulation circuit includes a phase detector, which is disposed in the analog system to measure the timing of the first clock signal relative to the second clock signal. The clock regulation circuit further includes a controllable delay element that is disposed in the digital system and a controller to regulate a delay of the delay element to regulate the timing based on the measurement of the timing by the phase detector.

In yet another example embodiment, an apparatus includes an integrated circuit that includes an analog component, a digital component, a clock generator module and a locked loop circuit. The analog component is clocked by a first clock signal; the digital component is clocked by a second clock signal; the clock generator module generates the first and second clock signals; and the locked loop circuit controls a relative timing of the first and second clock signals relative to each other. The locked loop circuit is distributed over analog and digital systems of the integrated circuit. The locked loop circuit includes a delay circuit that has a delay, which is controllably adjusted by the locked loop circuit to control the timing.

Advantages and other desired features will become apparent from the following drawings, description and claims.

DETAILED DESCRIPTION

An electrical system (a computer system, an integrated circuit, a microcontroller, as examples) may be a mixed signal system that includes an analog subsystem and a digital subsystem. Energy from the digital subsystem may produce some level of noise in the analog subsystem, and this noise, if not properly controlled, may adversely affect operation of the analog subsystem. Techniques and systems are disclosed herein, for purposes of regulating the relative timing of clock signals of a mixed signal system to mitigate, or suppress, such noise. As a more specific example, an analog sampling clock signal, which is used to time the sampling of an analog signal for purposes of analog-to-digital conversion in the mixed signal system, may be relatively prone to noise due to the coupling of the analog sampling clock signal to one or more digital clock signals of the digital subsystem. In this manner, a clock generator module of the digital subsystem may generate a digital clock signal from the analog sampling clock signal, or vice versa. As such, the analog sampling clock signal is susceptible to noise from its related digital clock signal. Techniques and systems are disclosed herein in example embodiments to regulate a relative timing of related clock signals used by the mixed signal system's analog and digital subsystems in a manner that mitigates, or suppresses, this noise.

One way to suppress the magnitude of digital subsystem-originating noise, which propagates into the analog subsystem is to space apart in time the logical transition edges (respective positive going, or rising, edges, for example) of related analog and digital clock signals. In this context, "an analog clock signal" refers to a clock signal that clocks, or synchronizes, the operation of at least one component of the analog subsystem; and a "digital clock signal" refers to a clock signal that clocks, or synchronizes, the operation of at least one component of the digital subsystem. One way to separate related clock signals in time is to communicate an analog/digital clock signal through a constant, or fixed, delay element to produce the related analog/digital clock signal so that the delay that is introduced by the delay element provides a time margin (a time margin of one quarter cycle, for example) between the corresponding logic transition edges of the clock signals.

In accordance with example systems and techniques that are disclosed herein, noise is suppressed through the use of a distributed delay locked loop (DLL) circuit for purposes of controlling the relative timing between related analog and digital clock signals. The "distributed" nature of the DLL circuit refers to the components of the DLL circuit being distributed between the digital and analog subsystems. In this manner, as further described below, in accordance with example embodiments, the distributed DLL circuit measures a timing between the related digital and analog clock signals using circuitry of the analog subsystem and controls the timing using a controllable delay element and controller of the digital subsystem. Among its potential advantages, the distributed DLL circuit-based noise control may be relatively insensitive to process variations.

Figure 1:
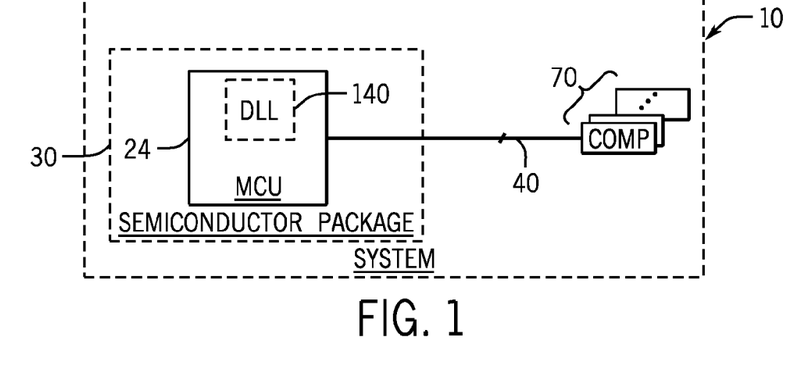
FIG. 1 is a schematic diagram of a microcontroller unit (MCU)-based system according to an example embodiment.

As a more specific example, FIG. 1 depicts a microcontroller unit (MCU) 24 of an example system 10. Although an MCU is disclosed herein as an example embodiment of a mixed signal system, it is understood that the systems and techniques that are disclosed herein may be applied to other mixed signal systems (an integrated circuit not containing an MCU, a computer system, a mixed signal integrated circuit, and so forth), in accordance with other example embodiments.

For the example embodiment that is depicted in FIG. 1, the MCU 24 controls various aspects of one or multiple components 70. As examples, the components 70 may include one of more of the following depending on the particular application in which the MCU 24 is used: an electrical motor, a household appliance, an inventory control terminal, a computer, a tablet, a smart power meter, a wireless interface, a cellular interface, an interactive touch screen user interface and so forth. All or part of the components of the MCU 24 may be part of an integrated circuit (IC) 200 that may be packaged to form the semiconductor package 30 (see FIG. 1). For example, all or part of the components of the MCU 24 may be fabricated on a single die or on multiple dies (a multi-chip module, for example) of the IC 200.

Figure 2:
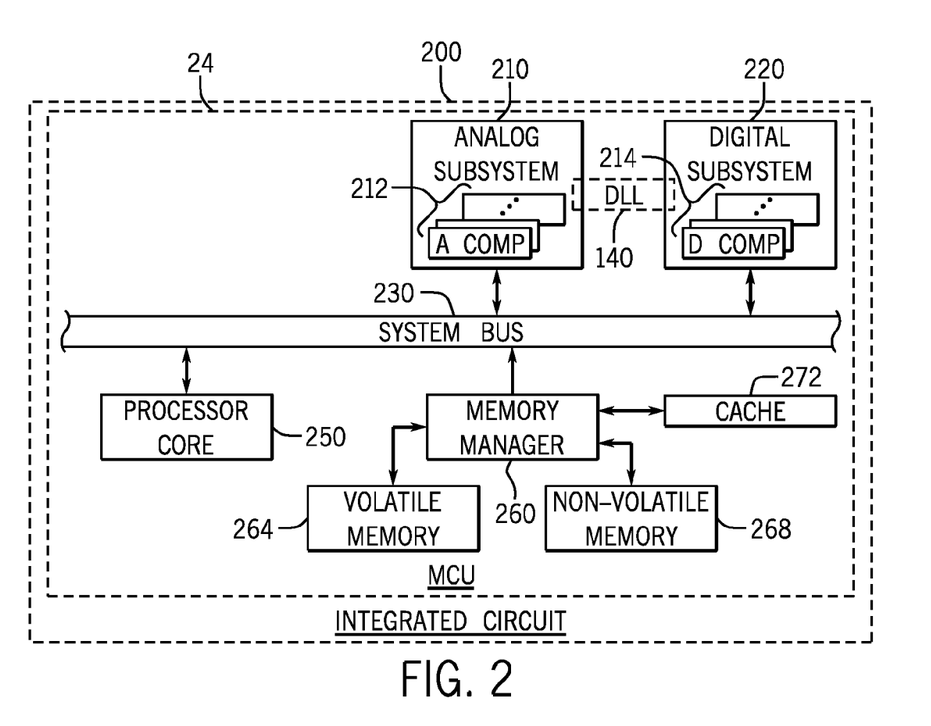
FIG. 2 is a schematic diagram of an MCU according to an example embodiment.

The MCU 24 includes a distributed delay locked loop (DLL) circuit 140 to regulate a relative timing between related digital and analog clock signals of the MCU 24 for purposes of mitigating, or suppressing, noise, which may otherwise propagate between the MCU's digital and analog subsystems. Referring to FIG. 2, among its components, the MCU 24 includes a processor core 250 and the DLL 140, which, as depicted in FIG. 2, contains components in both an analog subsystem 210 and a digital subsystem 220 of the MCU 24. Depending on the particular embodiment, the MCU 24 may not contain any of the components depicted in FIG. 2 other than the processor core 250 and the DLL 140; may contain one or more of the components that are depicted in FIG. 2 in addition to the processor core 250 and the DLL 140; may contain other and/or additional components other than the components that are depicted in FIG. 2; and so forth. Thus, many embodiments are contemplated, which are within the scope of the appended claims.

As an example, the processor core 250 may be a 32-bit core, such as the Advanced RISC Machine (ARM) processor core, which executes a Reduced Instruction Set Computer (RISC) instruction set. In general, the processor core 250 communicates with various other system components of the MCU 24, such as a memory controller, or manager 260, over a system bus 230. In general, the memory manager 260 controls access to various memory components of the MCU 24, such as a cache 272, a non-volatile memory 268 (a Flash memory, for example) and a volatile memory 264 (a static random access memory (SRAM), for example).

It is noted that FIG. 2 depicts an exemplary or simplified representation of the MCU architecture, as the MCU 24 may have many other components, bridges, buses, and so forth, in accordance with further embodiments, which are not depicted in FIG. 2. For example, in accordance with some embodiments, the MCU 24 may have a bus matrix module that implements slave side arbitration and is used to regulate access to the memory devices of the MCU 24.

In accordance with some embodiments, the analog 210 and digital 220 subsystems may communicate analog and digital signals with corresponding input/output (I/O) terminals of the MCU 24. The analog subsystem 210 includes components 212, which receive and/or provide analog signals, such as analog-to-digital converters (ADCs), analog sampling circuits, digital-to-analog converters (DACs), comparators, current drivers, voltage translators, current drivers and so forth. One or more of the components 212 may be clocked by a clock signal.

The digital subsystem 220 contains digital components 214, which may communicate with the processor core 250 over the system bus 230. As examples, the digital components 214 may include a Universal Serial Bus (USB) interface, a universal asynchronous receiver/transmitter (UART), a system management bus interface (SMB), a serial peripheral interface (SPI), a clock generator module, programmable timers and so forth. In general, the digital components 214 may communicate with devices that are external to the MCU 24 via corresponding I/O terminals. One or more of the digital components 214 may be clocked by a clock signal.

Figure 3:
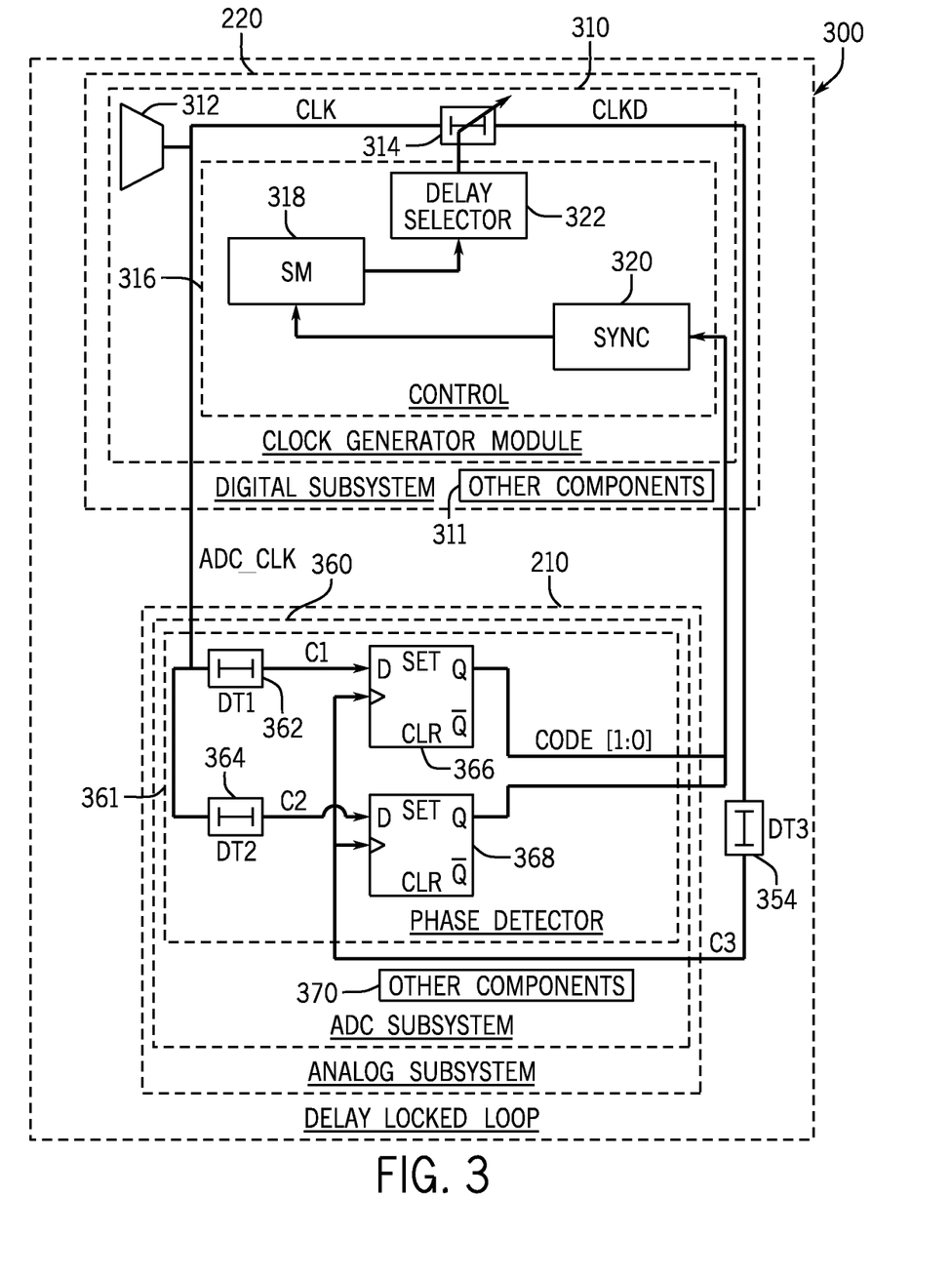
FIG. 3 is a schematic diagram of a distributed delay locked loop (DLL) circuit of the MCU of FIG. 2 according to an example embodiment.

In accordance with example, embodiments, the DLL circuit 140 may have an architecture represented by a distributed DLL circuit 300 that is depicted in FIG. 3. Referring to FIG. 3 in conjunction with FIG. 2, the distributed DLL circuit 300 includes components from both the digital subsystem 220 and the analog subsystem 210. More specifically, in accordance with an example embodiment, the DLL 300 includes a phase detector 361, which is part of the analog subsystem 210 (along with other components 370) for purposes of measuring the actual relative delay of an analog clock signal, such as an example analog sampling clock signal (called the "ADC_CLK analog sampling clock signal" herein). The phase detector 361 detects a phase between a digital clock signal, such as a "C3 clock signal," and the ADC_CLK analog sampling clock signal.

For the example embodiments discussed herein, the C3 clock signal is generated by a digital clock tree (not shown) of the digital subsystem 220 (one of many components 311) and is used to clock components of the digital subsystem 220 (bus interfaces, serial communication interfaces, the processor core 250 and so forth) for purposes of synchronizing their operations. The C3 clock signal is represented in FIG. 3 as being delayed by a delay element 354, which represents a delay (called "DT3" in FIG. 3) that is introduced by the digital clock tree of the digital subsystem 220. In general, the phase detector 361 measures a phase difference, or timing difference, between rising edges (as an example) of the C3 clock signal and corresponding rising edges of the ADC_CLK analog sampling clock signal, in accordance with example embodiments.

In general, the ADC_CLK analog sampling clock signal is used for purposes of the example embodiments described herein to clock sampling operations of the analog subsystem 210. In this manner, the ADC_CLK analog clock signal may be used, for example, for purposes of clocking the sampling of one or more analog signals (by a sample and hold circuit (not shown), for example) for purposes of analog-to-digital conversion by an ADC (not shown) of the analog subsystem 210.

As also depicted in FIG. 3, the C3 clock signal and the ADC_CLK analog sampling clock signal are coupled together. In other words, the ADC_CLK analog sampling clock signal and the C3 clock signal are derived from a common clock source 312 of a clock generator module 310 of the digital subsystem 220. Stated differently, the C3 clock signal is a delayed version of the ADC_CLK analog sampling clock signal, in accordance with example embodiments.

In this manner, as depicted in the example embodiment of FIG. 3, the clock source 312 generates the ADC_CLK analog sampling clock signal and provides a clock signal (called "CLK" in FIG. 3) representative of this signal to a programmable, or controllable, delay element 314 of the clock generator module 310. The delay element 314, in turn, produces a delayed clock signal (called the "CLKD clock signal" in FIG. 3) that is provided to clock the operations of the clock tree (not shown) of the digital subsystem's clock tree. The clock tree further introduces the DT3 delay to produce the C3 clock signal. Thus, the C3 clock signal is coupled to the ADC_CLK analog sampling clock signal and is a delayed version of the ADC_CLK analog sampling clock signal, i.e., delayed by the combination of the delays introduced by the controllable delay element 314 and the fixed delay element 354. Due to this coupling, significant noise energy from the digital subsystem 220 may propagate to the analog subsystem 210 via the ADC_CLK analog sampling clock signal, if not for the measures that are undertaken by the distributed DLL circuit 300.

In accordance with example embodiments, the distributed DLL circuit 300 includes a controller 316, which is disposed in the digital subsystem 220 for purposes of regulating the time delay that is introduced by the controllable delay element 314 to control the timing of the C3 clock signal relative to the ADC_CLK analog sampling clock signal. The controller 316, in turn, regulates this timing based on the measured phase difference between the ADC_CLK analog sampling clock signal and the C3 clock signal, which is acquired by the phase detector 361.

Figure 4A:
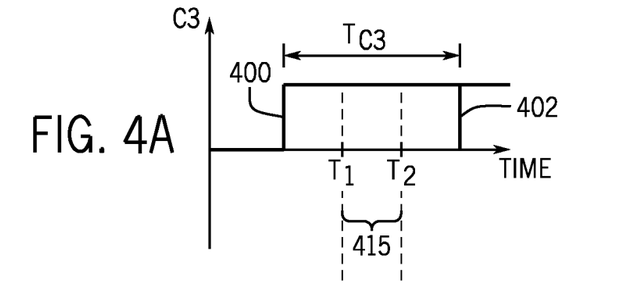
FIGS. 4A, 4B and 4C are example waveforms of the DLL circuit of FIG. 3 according to an example embodiment.

As a more specific example, in accordance with example embodiments, the distributed DLL circuit 300 may operate the delay element 314 to delay the C3 clock signal, as depicted in FIG. 4A. Referring to FIG. 4A in conjunction with FIG. 3, depending on the delay introduced by the controllable delay element 314, a given rising edge 400 of the C3 clock signal may appear anywhere time in an example time interval $T_{C3}$, depending on the delay that is introduced by the delay element 314. Thus, the logic zero-to-logic one transition may occur as early as a time before example time $T_2$ (as depicted by example rising edge 400) and may occur as late as a time after example rising edge $T_1$ (as depicted by example rising edge 402). The goal of the control by the distributed DLL circuit 300, in accordance with example embodiments, is to use the delay element 314 to regulate the timing of the rising edge of the C3 clock signal such that the rising edge of the C3 clock signal is between the illustrated $T_2$ and $T_1$ times of FIG. 4A. In other words, the $T_2$ and $T_1$ time for the example embodiment depicted in FIG. 4A define time boundaries of a control band 415 for regulating the time delay that is applied to the C3 clock signal. For purposes of measuring how much delay is being applied to the C3 clock signal, the phase detector 361 contains fixed, delay elements 362 and 364 (buffers or transistors, as examples).

Figure 4B:
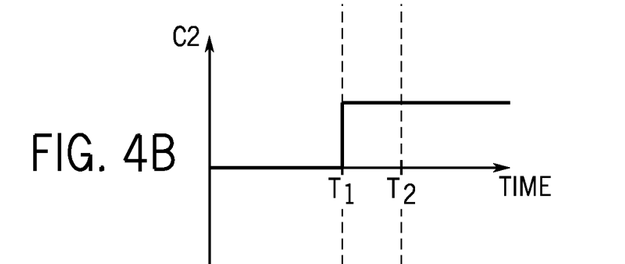
Figure 4C:
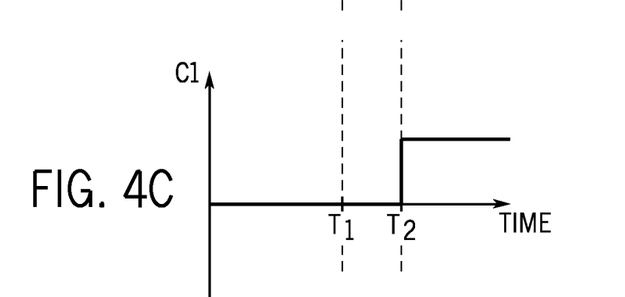

More specifically, referring to FIG. 4B in conjunction with FIGS. 3 and 4A, in accordance with an example embodiment, the delay element 364 introduces a delay (called "DT2" in FIG. 3) to the ADC_CLK analog sampling clock signal to produce a corresponding delayed, analog clock signal (called the "C2 analog clock signal" in FIG. 3), which has a rising edge to define the $T_2$ time, as depicted in FIG. 4B. Referring to FIG. 4C in conjunction with FIG. 3, the delay element 362 introduces a delay (called "DT1" in FIG. 3), which delays the ADC_CLK analog sampling clock signal to produce another delayed, clock signal (called the "C1 clock signal" herein), which has a rising edge that defines the $T_1$ time, as depicted in FIG. 4C. Thus, referring to FIGS. 4A, 4B and 4C, the C2 and C1 clock signals have corresponding rising edges that define the time boundaries of the control band 415 for purposes of regulating the delay applied by the controllable delay element 314 (FIG. 3) to produce the C3 clock signal.

The phase detector 361 samples the C1 and C2 clock signals for purposes of generating an indication of whether the C3 clock signal is within the control band 415. More specifically, in accordance with an example embodiment, the phase detector 361 includes a D-type flip-flop 366 (FIG. 3) to sample the C1 clock signal and a D-type flip-flop 368 to sample the C2 clock signal. In this regard, the D-type flip-flops 366 and 368 are clocked by the C3 clock signal (clocked on the rising edges of C3 clock signal, for example) and receive the C1 and C2 clock signals at their respective inputs. The non-inverting outputs of the D-type flip-flops 366 and 368 provide corresponding signals indicative of the corresponding sampled C1 and C2 clock signals.

More specifically, as depicted in FIG. 3, the non-inverting outputs of the flip-flops 366 and 368 collectively generate a two bit signal (called the "CODE[1:0] signal" herein). Referring to FIGS. 4A, 4B and 4C in conjunction with FIG. 3, when the CODE[1:0] signal represents, or indicates, a bit sequence of "10," the rising edge of the C3 clock signal is within the control band 415. Otherwise, when the CODE[1:0] signal does not indicate a bit sequence of "10," the controller 316 adjusts the delay that is introduced by the controllable delay element 314 for purposes of adjusting the timing of the C3 clock signal relative to the ADC_CLK analog clock signal.

As depicted in FIG. 3, the controller 316 may include, for example, a synchronizer 320 for purposes of synchronizing the sampling of the CODE[1:0] signal, a state machine 318 for purposes of deciding when and how to adjust the delay that is introduced by the controllable delay element 314, and a delay selector 322 for purposes of receiving a digital value to program a corresponding delay value for the controllable delay element 314.

Figure 5:
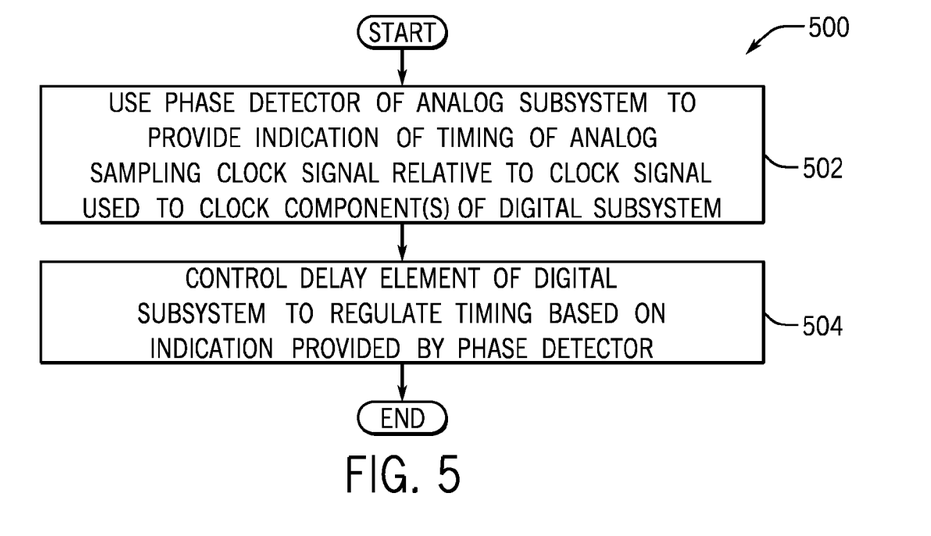
FIG. 5 is a flow diagram depicting a technique control digital system-generated noise according to an example embodiment.

Thus, referring to FIG. 5, in accordance with an example embodiment, a technique 500 includes using (block 502) a phase detector of an analog subsystem to provide an indication of a timing of an analog sampling clock signal relative to a clock signal that clocks operations of at least one component of a digital subsystem. Pursuant to the technique 500, the delay element of the digital subsystem is controlled, pursuant to block 504, to regulate the timing based on an indication that is provided by the phase detector.

Figure 6:
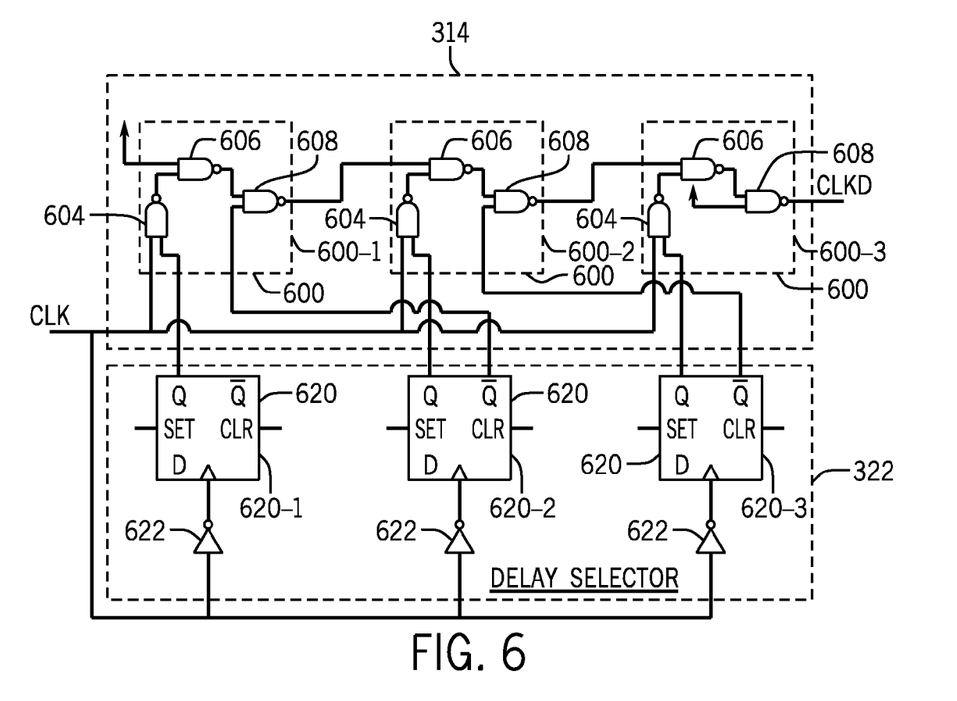
FIG. 6 is a schematic diagram of a clock generator module of FIG. 3 according to an example embodiment.

FIG. 6 depicts an example embodiment for the delay selector 322 and the controllable delay element 314. Although FIG. 6 depicts a cascaded chain of three delay elements 600 (i.e., delay elements 600-1, 600-2 and 600-3) for the delay element 314, it is understood that the delay element 314 may have more than three delay elements or fewer than three delay elements, depending on the particular example embodiment. For this example embodiment, the delay selector 322 includes a three bit register, which receives a three bit value corresponding to the desired delay to be introduced by the controllable delay element 314. In this manner, the delay selector 322 may be formed from three D-type flip-flops 620 (D-type flip-flops 620-1, 620-2 and 620-3, being depicted in FIG. 6), which form respective bits of the three bit register. Each flip-flop 620 is clocked by the ADC_CLK analog sampling clock signal (clocked on the falling edges of the ADC_CLK analog sampling clock signal due to an inverted version of the signal being provided by corresponding inverters 622, for example); and the values stored by the flip-flops 620 may be updated via corresponding set and clear inputs of the flip-flops 620.

The inverting and non-inverting outputs of the flip-flops 620 control the delay elements 600 of the controllable delay element 314 as follows. The delay circuit 600 includes a NAND gate 604, which controls whether the ADC_CLK analog sampling clock signal propagates through the circuit 600 or not. In this regard, one input of the NAND gate 604 is coupled to receive the ADC_CLK analog sampling clock signal, and another input of the NAND gate 604 is coupled to a corresponding D-type flip-flop 620 so that the corresponding bit of the delay selector 322 controls gating of the ADC_CLK analog sampling clock signal for that circuit 600. The output of the NAND gate 604 is coupled to an input of a NAND gate 606 of the delay circuit 600.

The NAND gate 606 controls whether the delay circuit 600 receives its clock signal from another delay circuit 600 or whether the delay circuit 600 receives the ADC_CLK analog sampling clock signal. As depicted in FIG. 6, an input of the NAND gate 606 of the first delay circuit 600-1 is coupled to a logic one signal (i.e., is always configured to pass through the ADC_CLK analog clock signal). The NAND gate 606 has an input coupled to an output of the delay circuit 600-1; and the NAND gate 606 of the delay circuit 600-3 is coupled to an output of the delay circuit 600-2. The output of the NAND gate 606 is coupled to an input of a NAND gate 608 of the delay circuit 600.

The NAND gate 608 controls the gating of the output for the delay circuit 600. As depicted in FIG. 6, an input of the NAND gate 608 is coupled to the inverting output of the flip-flop 620-2; an input of the NAND gate 608 of the delay circuit 600-2 is coupled to the inverting output of the flip-flop 620-3; and an input of the NAND 608 of the delay circuit 600-3 is coupled to a logic one value. Due to the example embodiment of the controllable delay element 314 and delay selector 322 of FIG. 6, three values may be programmed into the delay selector 322 to select three corresponding delays for the delay value for the controllable delay element 314: 001 (the minimum delay value in which the ADC_CLK analog clock signal propagates solely through the delay circuit 600-3); 010; and 100 (the delay value for the controllable delay element 314 in which the ADC_CLK analog clock signal propagates through all three delay circuits 600-1, 600-2 and 600-3).

Figure 7:
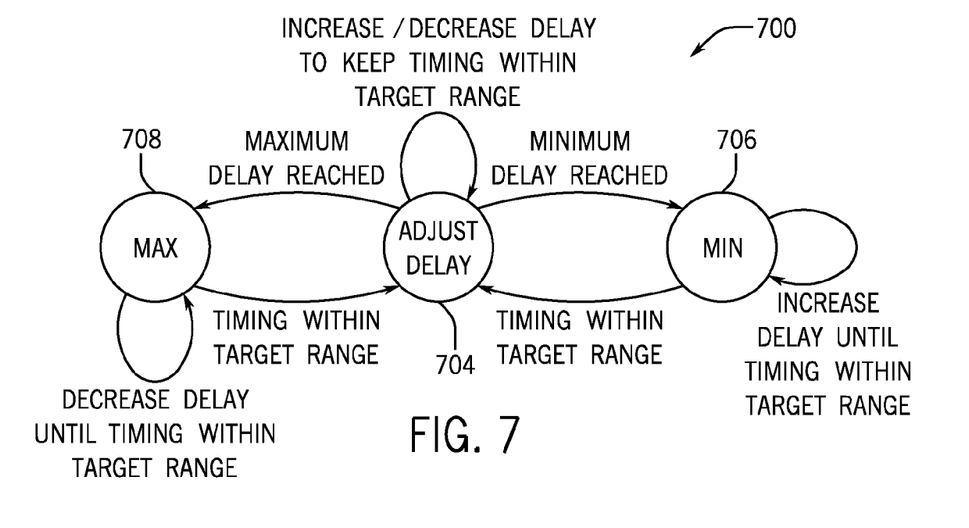
FIG. 7 is a state diagram illustrating operation of a state machine of the clock generator module of FIG. 3 according to an example embodiment.

Referring to FIG. 7 in conjunction with FIG. 3, in accordance with an example implementation, that state machine 318 of the controller 316 may operate pursuant to a state diagram 700 (FIG. 7). In general, the state diagram 700 includes an ADJUST DELAY state 704, a state in which the state machine 318 remains while the delay value for the controllable delay element 314 is neither at its maximum or minimum value. In this regard, in the ADJUST DELAY state 704, the state machine 318 increases or decreases the delay value, as appropriate, until the CODE[1:0] signal value represents a "10" to indicate that the edge of the C3 clock signal is within the control band. When the delay value is at its maximum, the state machine 318 transitions to a MAX state 708, in which the state machine 318 decreases the delay value until the C3 clock signal is within the control band 415 (see FIG. 4A). When the delay value for the controllable delay element 314 is at its minimum value, the state machine 318 transitions to a MIN state 706, in which the state machine 318 remains until the state machine 318 decreases the delay value for the controllable delay element 314 until the C3 clock signal is within the control band 415.

Figure 8:
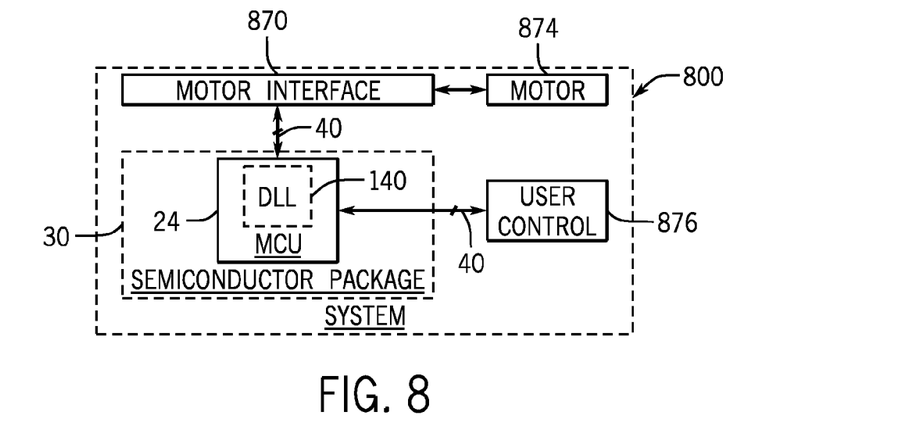
FIG. 8 is a schematic diagram of an MCU-based motor control system according to an example embodiment.

The MCU 24 may be used in numerous different applications. As an example, FIG. 8 depicts a motor control application in which an MCU 24 of a motor control system 800 generates/receives input and output signals (I/O signals) for purposes of controlling a motor 874. In this manner, the MCU 24 may generate signals at its I/O terminals 40 for purposes of communicating with a motor interface 870 (an interface containing drivers, sensors, and so forth); and in connection with this communication, the I/O terminals 40 may communicate waveforms with the motor interface (pulse width modulation (PWM) signals, for example), receive sensed currents and voltages, communicate data via one or more serial buses, and so forth. I/O terminals 40 of the MCU 24 may further generate/receive signals to communicate with a user control interface 876 of the system 800 for such purposes as communicating status of the motor 874 or motor interface 870, communicating detected fault conditions, receiving user-directed commands and signals, and so forth.

While a limited number of embodiments have been disclosed herein, those skilled in the art, having the benefit of this disclosure, will appreciate numerous modifications and variations therefrom. It is intended that the appended claims cover all such modifications and variations.

What is claimed is:

1. A method comprising:
   generating one of a first clock signal and a second clock signal from the other clock signal, the first clock signal being configured to be used to synchronize an operation of an analog system and the second clock signal being configured to be used to synchronize an operation of a digital system; and
   using a phase detector of the analog system to measure a timing of the first clock signal relative to the second clock signal,
   wherein the generating comprises controlling a delay element of the digital system to regulate the timing based on the measurement of the timing by the phase detector to suppress noise in the analog system.

2. The method of claim 1, wherein the controlling comprises controlling a delay of a delay element of a locked loop circuit in response to a measurement provided by a phase detector of the locked loop circuit.

3. The method of claim 1, further comprising:
   sampling an analog signal in the analog system in response to the first clock signal.

4. The method of claim 1, further comprising:
   generating the second clock signal from the first clock signal,
   wherein the timing is regulated to suppress a noise in the analog system produced due to a coupling of the first and second clock signals.

5. The method of claim 1, wherein using the phase detector to measure the timing comprises:
   delaying the first clock signal using a plurality of delay elements of the analog system to generate a plurality of delayed first clock signals; and
   using a signal synchronized to the second clock signal to trigger sampling of the plurality of delayed first clock signals to generate a plurality of samples collectively representing the timing.

6. The method of claim 5, wherein the plurality of samples represent a digital value indicative of the timing, and controlling the delay element comprises selectively increasing and decreasing the delay based at least in part on a comparison of the digital value to a reference value.

7. An apparatus comprising:
an analog system adapted to synchronize at least one operation to a first clock signal;
a digital system adapted to synchronize at least one operation to a second clock signal, wherein the first and second clock signals are electrically coupled together; and
a clock regulation circuit adapted to regulate a timing of the first clock signal relative to the second clock signal to control a noise contained in the first clock signal, the clock regulation circuit comprising:
  a phase detector disposed in the analog system to measure a timing of the first clock signal relative to the second clock signal;
  a controllable delay element disposed in the digital system; and
  a controller to regulate a delay of the delay element to regulate the timing based on the measurement of the timing by the phase detector.

8. The apparatus of claim 7, wherein the clock regulation circuit comprises a delay locked loop (DLL) circuit.

9. The apparatus of claim 7, wherein the digital system comprises a clock generator to generate the first and second clock signals.

10. The apparatus of claim 7, wherein the analog system comprises a sampling circuit to respond to the first clock signal.

11. The apparatus of claim 7, wherein the phase detector comprises:
  a plurality of delay elements to delay a signal representative of the first clock signal to generate a plurality of delayed clock signals; and
  a plurality of samplers to sample the delayed clock signals in response to the second clock signal to generate an indication of the timing.

12. The apparatus of claim 11, wherein the controller is adapted to selectively adjust a delay of the delay element based at least in part on the indication generated by the samplers.

13. The apparatus of claim 12, wherein the controller is adapted to selectively adjust a number of delay circuits forming a cascaded delay chain of the delay circuit based at least in part on the indication generated by the samplers.

14. An apparatus comprising:
an integrated circuit comprising a processor core, an analog component clocked by a first clock signal, a digital component clocked by a second clock signal, a clock generator module to generate the first clock signal and the second clock signal, and a locked loop circuit to control a relative timing of the first and second clock signals,
wherein the locked loop circuit comprises a controller disposed in a digital system of the integrated circuit, a delay circuit having a delay controllably adjusted by the locked loop circuit to control the timing and a phase detector disposed in an analog system of the integrated circuit that measures the timing, and
wherein the processor core is clocked by a clock signal synchronized to the second clock signal.

15. The apparatus of claim 14, wherein the analog component is disposed in the analog system of the integrated circuit.

16. The apparatus of claim 14, wherein the phase detector comprises:
  a plurality of delay elements to generate a plurality of delayed analog clock signals in response to the first clock signal; and
  a plurality of samplers to sample the delayed analog clock signals in response to the second signal to generate a value indicative of the timing.

17. The apparatus of claim 14, wherein the delay circuit comprises a cascaded chain of selectively enabled delay elements.

18. The apparatus of claim 17, wherein the locked loop circuit is adapted to selectively enable the delay elements based at least in part on the timing.

19. The apparatus of claim 14, wherein the locked loop circuit comprises a delay locked loop (DLL) circuit.

* * * * *